(12) United States Patent
Chou et al.

(10) Patent No.: US 11,025,204 B2
(45) Date of Patent: Jun. 1, 2021

(54) CIRCUIT HAVING HIGH-PASS FILTER WITH VARIABLE CORNER FREQUENCY

(71) Applicant: MEDIATEK INC., Hsin-Chu (TW)

(72) Inventors: Ying-Wei Chou, Hsinchu (TW); Sung-Han Wen, Hsinchu (TW); Chen-Chien Lin, Hsinchu (TW); Jou Lee, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 260 days.

(21) Appl. No.: 16/149,145

(22) Filed: Oct. 2, 2018

(65) Prior Publication Data
US 2019/0131935 A1 May 2, 2019

Related U.S. Application Data

(60) Provisional application No. 62/580,500, filed on Nov. 2, 2017.

(51) Int. Cl.
H04B 15/00 (2006.01)
H03F 1/34 (2006.01)
H03H 7/06 (2006.01)
H03F 3/181 (2006.01)
H04R 3/04 (2006.01)
H03G 5/12 (2006.01)
H03F 3/187 (2006.01)
H03F 3/45 (2006.01)

(52) U.S. Cl.
CPC ............... H03F 1/34 (2013.01); H03F 3/181 (2013.01); H03F 3/187 (2013.01); H03F 3/45475 (2013.01); H03G 5/12 (2013.01); H03H 7/06 (2013.01); H04R 3/04 (2013.01); H03F 2200/03 (2013.01); H03F 2200/129 (2013.01); H03F 2200/144 (2013.01); H03F 2200/165 (2013.01); H03F 2200/267 (2013.01); H03F 2200/42 (2013.01); H03F 2203/45134 (2013.01); H03F 2203/45136 (2013.01); H03F 2203/45151 (2013.01); H03F 2203/45156 (2013.01); H03F 2203/45332 (2013.01); H03F 2203/45336 (2013.01); H03F 2203/45512 (2013.01); H03F 2203/45514 (2013.01); H03F 2203/45526 (2013.01); H03F 2203/45528 (2013.01); H03F 2203/45534 (2013.01); H03F 2203/45536 (2013.01); H03F 2203/45544 (2013.01); H03F 2203/45546 (2013.01); H03F 2203/45594 (2013.01); H03F 2203/45601 (2013.01); H03F 2203/45616 (2013.01); H03F 2203/45618 (2013.01); H03F 2203/45632 (2013.01); H03F 2203/45698 (2013.01)

(58) Field of Classification Search
CPC ..................................................... H04B 15/00
See application file for complete search history.

(56) References Cited

U.S. PATENT DOCUMENTS 6,133,784 A 10/2000 Gregoire
6,226,322 B1 5/2001 Mukherjee
6,424,209 B1 7/2002 Gorecki et al.
(Continued)

Primary Examiner — Olisa Anwah
(74) Attorney, Agent, or Firm — Winston Hsu

(57) ABSTRACT

The present invention provides a circuit having a filter with an amplifier circuit for filtering and amplifying an input signal to generate an output signal, wherein a corner frequency of the filter is adjustable to control a settling time of the output signal.

11 Claims, 6 Drawing Sheets

(56) References Cited

U.S. PATENT DOCUMENTS

| | | |
|---|---|---|
| 6,608,527 B2 | 8/2003 | Moloudi et al. |
| 6,714,066 B2 | 3/2004 | Gorecki et al. |
| 6,968,167 B1 | 11/2005 | Wu et al. |
| 6,975,838 B1 | 12/2005 | Rofougaran et al. |
| 7,113,744 B1 | 9/2006 | Moloudi et al. |
| 7,233,772 B1 | 6/2007 | Darabi et al. |
| 8,320,586 B2 | 11/2012 | Shen |
| 8,638,165 B2 | 1/2014 | Shah et al. |
| 8,855,335 B2 | 10/2014 | Henriksen |
| 2007/0100611 A1 | 5/2007 | Ps et al. |
| 2010/0048985 A1 | 2/2010 | Henke et al. |
| 2010/0246859 A1 | 9/2010 | David |
| 2011/0140785 A1* | 6/2011 | Lian .................. H03H 11/1291 330/293 |
| 2011/0142261 A1 | 6/2011 | Josefsson |
| 2012/0019318 A1* | 1/2012 | Lee ........................ H03H 7/25 330/86 |
| 2012/0121106 A1* | 5/2012 | Henriksen .......... H03F 3/45475 381/94.1 |
| 2013/0154740 A1* | 6/2013 | Xie ....................... H03G 3/001 330/260 |
| 2015/0200635 A1 | 7/2015 | Wang |

\* cited by examiner

US 11,025,204 B2

CIRCUIT HAVING HIGH-PASS FILTER WITH VARIABLE CORNER FREQUENCY

CROSS REFERENCE TO RELATED APPLICATIONS

This application claims the priority of US Provisional Application No. 62/580,500, filed on Nov. 2, 2017, which is included herein by reference in its entirety.

BACKGROUND

Audio latency is the time delay as an audio signal passes through a system. Many classes of applications rely on short latencies to achieve real-time sound effects, especially when a device starts to receive and record the audio signal. The audio latency may be shortened by using specific resistances and capacitances in the circuit designs. However, these designs generally worsen the audio data recording performance.

SUMMARY

It is therefore an objective of the present invention to provide a circuit having short audio latency without influencing the data recording performance, to solve the above-mentioned problem.

According to one embodiment of the present invention, a circuit having a filter with an amplifier circuit is disclosed. The filter with an amplifier circuit is configured for filtering and amplifying an input signal to generate an output signal, wherein a corner frequency of the filter is adjustable to control a settling time of the output signal.

According to another embodiment of the present invention, an input stage of a chip is provided, wherein the input stage comprises a variable resistor and an amplifier with a feedback resistor. The variable resistor is configured for directly receiving an input signal from a pad of the chip to generate a first signal. The amplifier with a feedback resistor is configured for amplifying the first signal to generate an output signal, wherein in a first mode, the variable resistor is controlled to have a first resistance to shorten a settling time of the output signal; and in a second mode, the variable resistor is controlled to have a second resistance greater than the first resistance.

According to another embodiment of the present invention, an input stage of a chip is provided, wherein the input stage comprises an input capacitor and an amplifier with a feedback resistor and a feedback capacitor. The input capacitor is configured for directly receiving an input signal from a pad of the chip to generate a first signal. The amplifier with a feedback resistor and a feedback capacitor is configured for amplifying the first signal to generate an output signal, wherein the feedback resistor is a variable feedback resistor, or the feedback capacitor is a variable feedback capacitor. In a first mode, the feedback resistor or the feedback capacitor is controlled to have a first resistance/capacitance to shorten a settling time of the output signal, and in a second mode, the feedback resistor or the feedback capacitor is controlled to have a second resistance/capacitance greater than the first resistance/capacitance.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
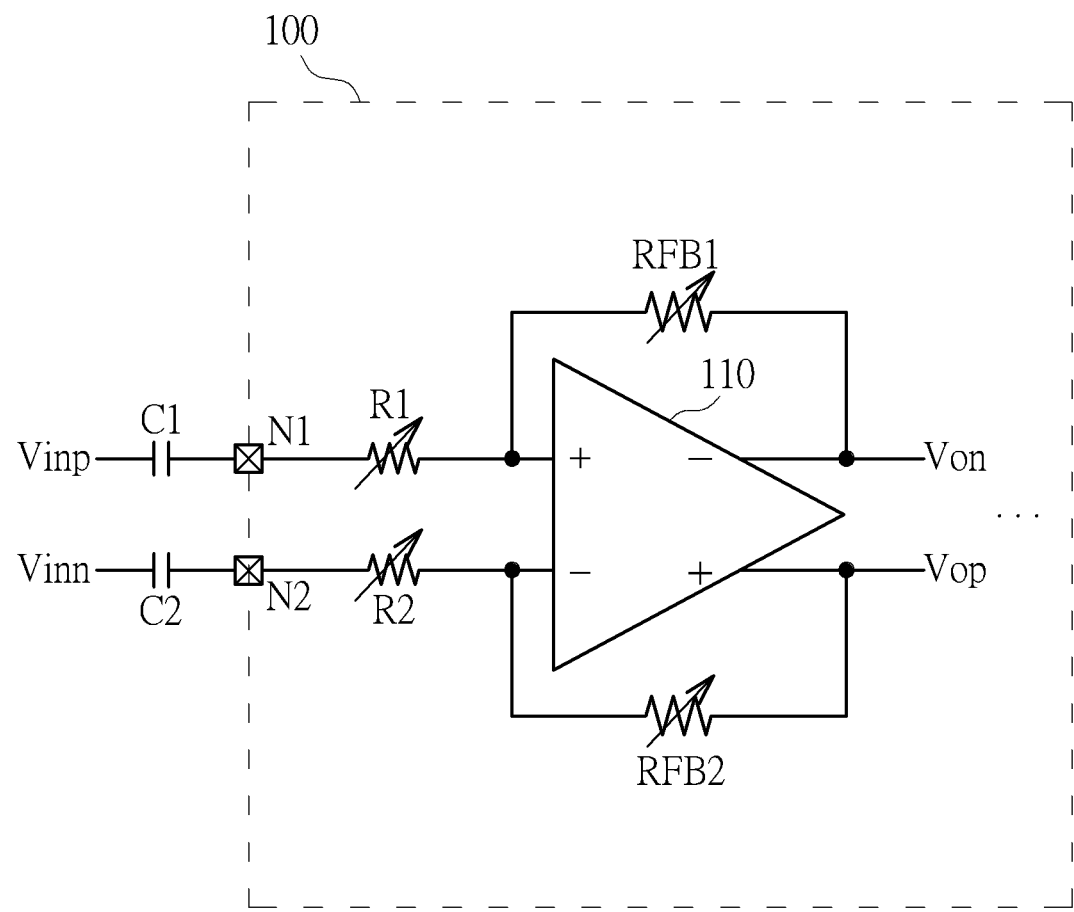
FIG. 1 is a diagram illustrating a circuit according to one embodiment of the present invention.

FIG. 1 is a diagram illustrating a circuit 100 according to one embodiment of the present invention. As shown in FIG. 1, the circuit 100 can be a chip comprising two pads N1 and N2, two variable resistors R1 and R2, and an amplifier 110 with variable feedback resistors RFB1 and RFB2, wherein the elements within the circuit 100 shown in FIG. 1 serve as an input stage of the circuit 100. In this embodiment, the pads N1 and N2 of the circuit 100 are coupled to two capacitors C1 and C2 positioned on a printed circuit board (PCB), respectively, and the input stage of the circuit 100 receives input signals Vinp and Vinn via the capacitors C1 and C2 to generate output signals Von and Vop to the following processing circuits within the circuit 100. In this embodiment, the circuit 100 is capable of processing the audio signal, and the input signals Vinp and Vinn are audio signals from a microphone.

In one embodiment, the amplifier 110 may be a linear amplifier or a switching amplifier.

In the embodiment shown in FIG. 1, the variable resistor R1 and the capacitor C1 form a high-pass filter, and the variable resistor R2 and the capacitor C2 form another high-pass filter. Taking the high-pass filter comprising the variable resistor R1 and the capacitor C1 as an example, when the circuit 100 starts to process the input signals Vinp and Vinn (e.g. a user controls an electronic device to start to recognize and/or record the audio signals), the input stage of the circuit 100 operates in a first mode and the variable resistor R1 can be controlled to have lower resistance (e.g. 1 k ohm). At this time, because a product of the variable resistor R1 and the capacitor C1 is lower, the high-pass filter comprising the variable resistor R1 and the capacitor C1 have higher 3-dB corner frequency, and the settling time of the output signals Von and Vop are shortened. A curve 210 shown in FIG. 2 is a frequency response when the circuit 100 starts to process the input signals Vinp and Vinn.

Figure 2:
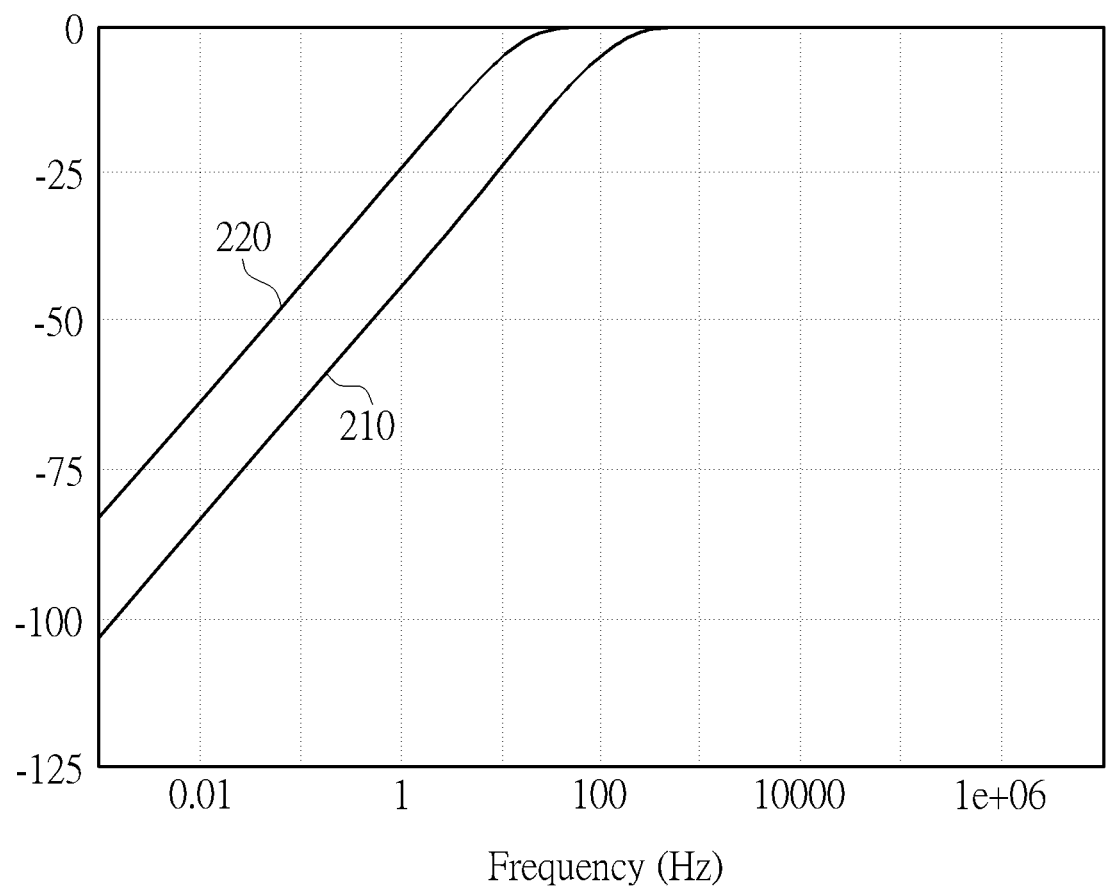
FIG. 2 shows frequency responses of two modes of the circuit according to one embodiment of the present invention.

As shown in FIG. 2, although the lower product of the variable resistor R1 and the capacitor C1 can improve the settling time of the output signals Von and Vop, some of the low-frequency components comprising human audio spectrum 20 Hz-20 kHz of the input signals Vinp and Vinn may be filtered, and the output signals Von and Vop may have worse performance. Therefore, when the output signals Von and Vop become stable or a period of time later, the input stage of the circuit 100 operates in a second mode and the variable resistor R1 can be controlled to have higher resistance (e.g. 10 k ohm). At this time, because the product of the variable resistor R1 and the capacitor C1 is higher, the high-pass filter comprising the variable resistor R1 and the capacitor C1 have lower 3-dB corner frequency, and the output signals Von and Vop can comprise the low-frequency components to ensure the audio recording performance. A curve 220 shown in FIG. 2 is a frequency response when the variable resistor R1 is controlled to have higher resistance.

In one embodiment, a glitch detection operation is performed by hardware or software to determine if the output signals Von and Vop are stable. For example, the output signals Von and Vop generally have glitches when the circuit 100 starts to process the input signals Vinn and Vinp, and if it is detected that the glitches at the output signals Von and Vop are reduced to a predetermined level, the circuit can determine that the output signals Von and Vop become stable.

In addition, the resistances of the variable feedback resistors RFB1 and RFB2 are controlled according to the resistances of the variable resistors R1 and R2, respectively. For example, if the resistance of the variable resistors R1 is controlled to have the lower resistance, the variable feedback resistor RFB1 is also controlled to have the lower resistance (e.g. 8 k ohm); and if the resistance of the variable resistors R1 is controlled to have the higher resistance, the variable feedback resistor RFB1 is also controlled to have the higher resistance (e.g. 80 k ohm).

Figure 3:
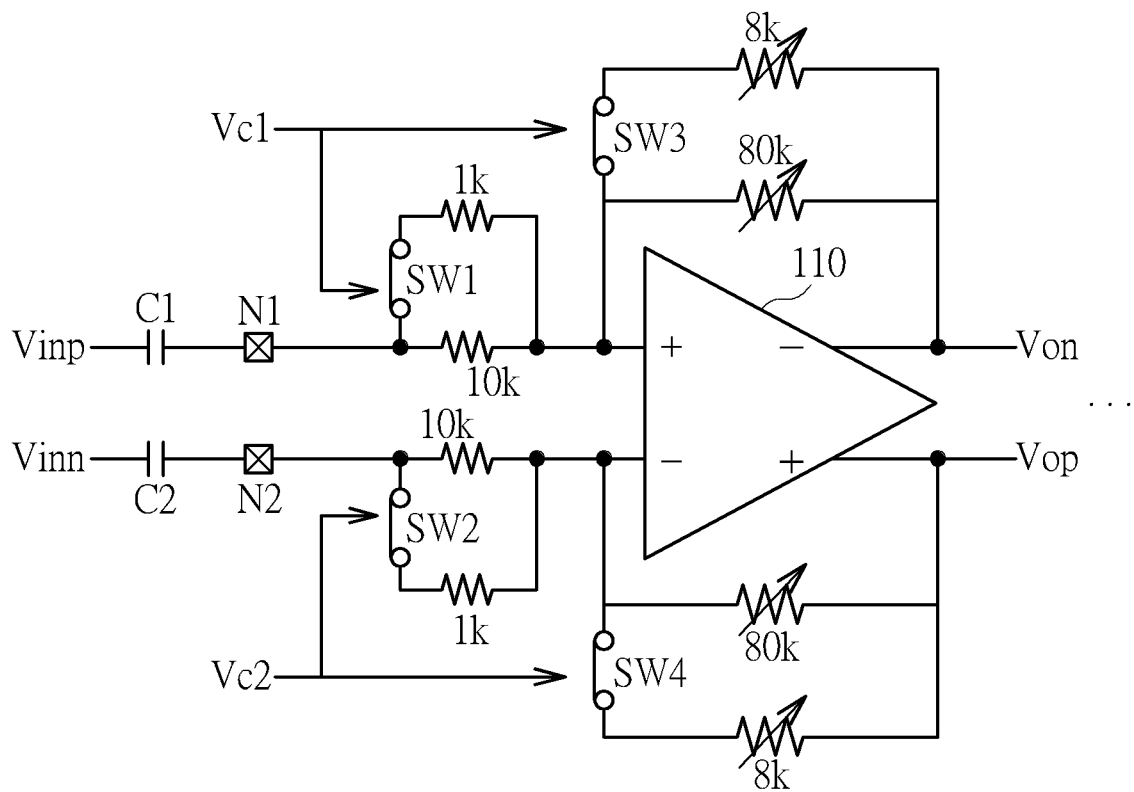
FIG. 3 is a diagram of controlling the variable resistors and the variable feedback resistors when the circuit starts to process the input signals and according to one embodiment of the present invention.

FIG. 3 is a diagram of controlling the variable resistors R1 and R2 and the variable feedback resistors RFB1 and RFB2 when the circuit 100 starts to process the input signals Vinp and Vinn according to one embodiment of the present invention. As shown in FIG. 3, the variable resistor R1 comprises a switch SW1 and two resistors having the resistances 1 k ohm and 10 k ohm, the variable resistor R2 comprises a switch SW2 and two resistors having the resistances 1 k ohm and 10 k ohm, the variable feedback resistor RFB1 comprises a switch SW3 and two resistors having the resistances 8 k ohm and 80 k ohm, and the variable feedback resistor RFB2 comprises a switch SW4 and two resistors having the resistances 8 k ohm and 80 k ohm, where the switches SW1 and SW3 are controlled by a control signal Vc1, and the switches SW2 and SW4 are controlled by another control signal Vc2. When the circuit 100 starts to process the input signals Vinp and Vinn, the control signal Vc1 turns on the switches SW1 and SW3 to make the variable resistor R1 and the variable feedback resistor RFB1 have the lower resistances, and the control signal Vc2 turns on the switches SW2 and SW4 to make the variable resistor R2 and the variable feedback resistor RFB2 have the lower resistances.

Figure 4:
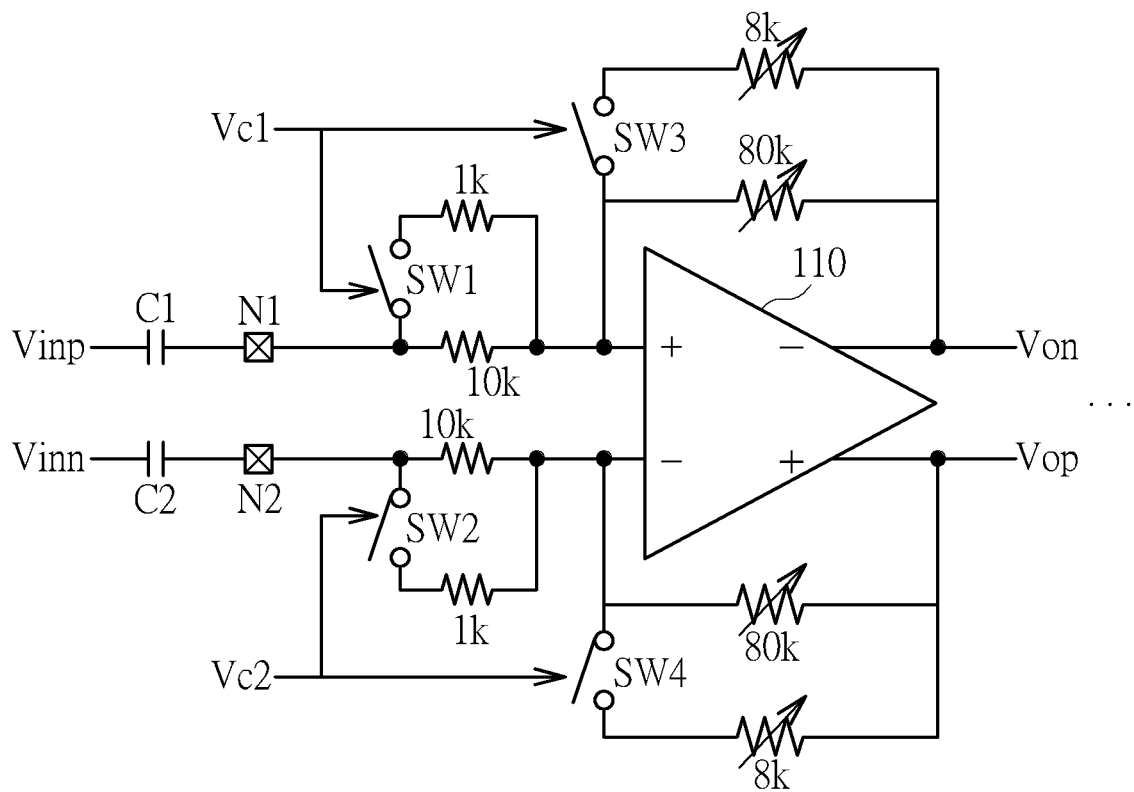
FIG. 4 is a diagram of controlling the variable resistors and the variable feedback resistors when the output signals are stable.

In addition, when the output signals Von and Vop become stable or a period of time later, the control signal Vc1 turns off the switches SW1 and SW3 to make the variable resistor R1 and the variable feedback resistor RFB1 have the higher resistances, and the control signal Vc2 turns off the switches SW2 and SW4 to make the variable resistor R2 and the variable feedback resistor RFB2 have the higher resistances as shown in FIG. 4.

Figure 5:
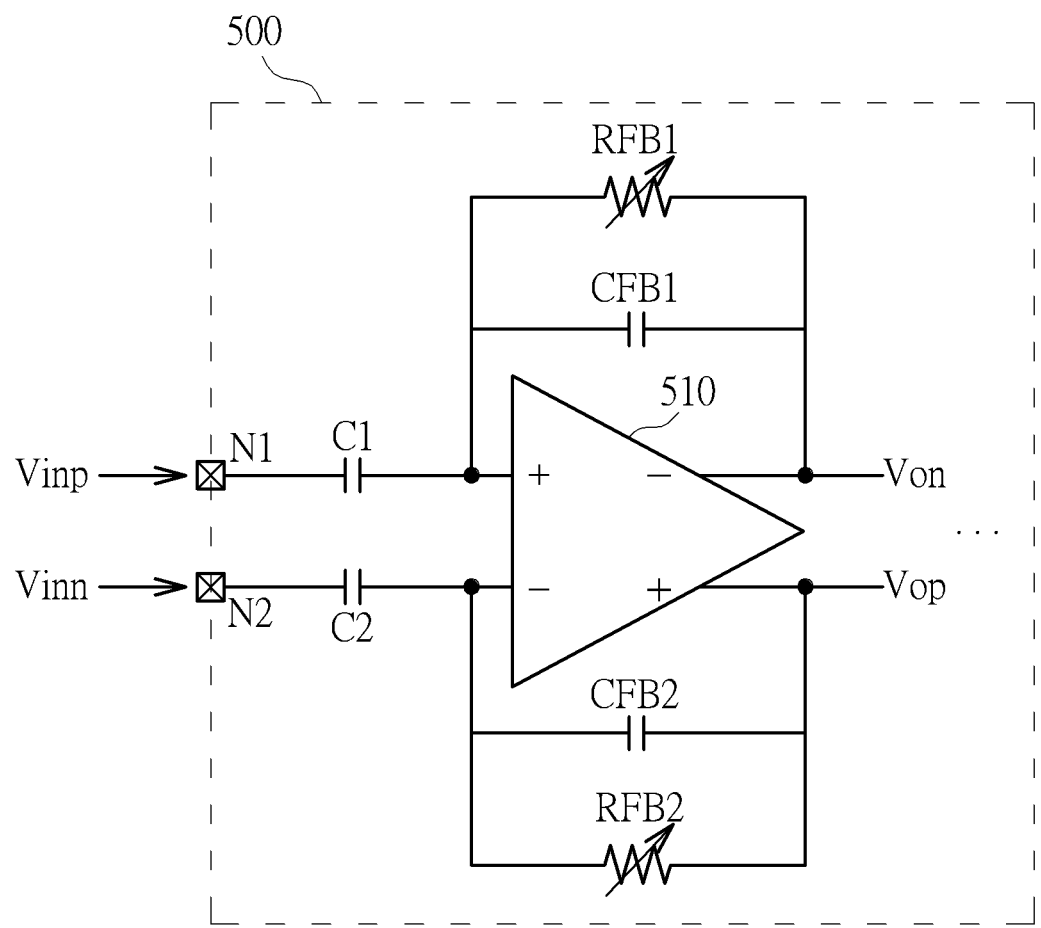
FIG. 5 is a diagram illustrating a circuit according to another embodiment of the present invention.

FIG. 5 is a diagram illustrating a circuit 500 according to another embodiment of the present invention. As shown in FIG. 5, the circuit 500 can be a chip comprising two pads N1 and N2, two input capacitors C1 and C2, and an amplifier 510 with variable feedback resistors RFB1 and RFB2 and feedback capacitors CFB1 and CFB2, where the elements within the circuit 500 shown in FIG. 5 serve as an input stage. In this embodiment, the circuit 500 receives input signals Vinp and Vinn via the pads N1 and N2 to generate output signals Von and Vop to the following processing circuits within the circuit 500. In this embodiment, the circuit 500 is capable of processing the audio signal, and the input signals Vinp and Vinn are audio signals from a microphone.

In one embodiment, the amplifier 510 may be a linear amplifier or a switching amplifier.

In the embodiment shown in FIG. 5, the variable feedback resistor RFB1 and the feedback capacitor CFB1 form a high-pass filter, and the variable feedback resistor RFB2 and the feedback capacitor CFB2 form another high-pass filter. Taking the high-pass filter comprising the variable feedback resistor RFB1 and the feedback capacitor CFB1 as an example, when the circuit 500 starts to process the input signals Vinp and Vinn (e.g. a user controls an electronic device to start to recognize and/or record the audio signals), the input stage of the circuit 500 operates in a first mode and the variable feedback resistor RFB1 can be controlled to have lower resistance. At this time, because a product of the variable feedback resistor RFB1 and the feedback capacitor CFB1 is low, the high-pass filter comprising the variable feedback resistor RFB1 and the feedback capacitor CFB1 have higher 3-dB corner frequency, and the settling time of the output signals Von and Vop are shortened. The frequency response is similar to the curve 210 when the circuit 500 starts to process the input signals Vinp and Vinn.

When the output signals Von and Vop become stable or a period of time later, the input stage of the circuit 500 operates in a second mode and the variable feedback resistor RFB1 can be controlled to have higher resistance. At this time, because the product of the variable feedback resistor RFB1 and the feedback capacitor CFB1 is higher, the high-pass filter comprising the variable feedback resistor RFB1 and the feedback capacitor CFB1 have lower 3-dB corner frequency, and the output signals Von and Vop can comprise the low-frequency components to ensure the audio recording performance. The frequency response is similar to the curve 220 shown in FIG. 2 when the variable resistor R1 is controlled to have higher resistance.

Figure 6:
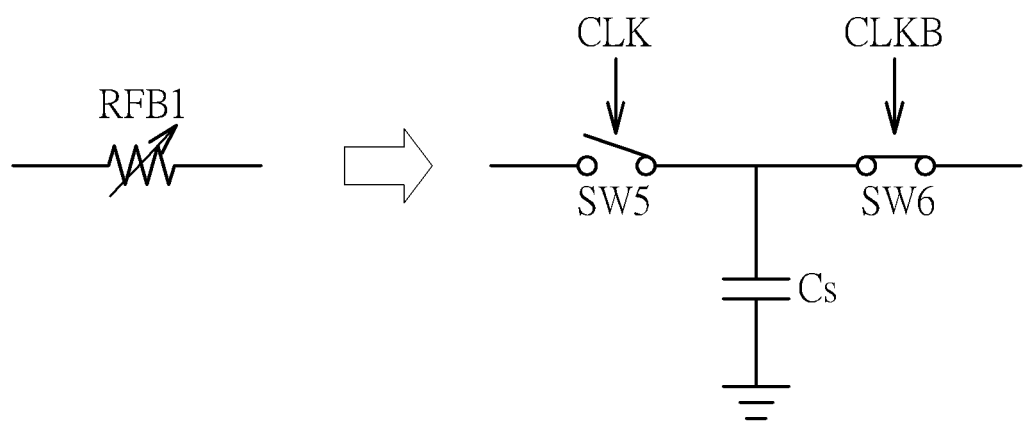
FIG. 6 is a diagram illustrating the variable feedback resistor according to one embodiment of the present invention.

FIG. 6 shows the variable feedback resistor RFB1 according to one embodiment of the present invention. As shown in FIG. 6, the variable feedback resistor RFB1 is implemented by a capacitor Cs and two switches SW5 and SW6, where the switches SW5 and SW6 are controlled by a clock signal CLK and an inverted clock signal CLKB, respectively. The resistance of the variable feedback resistor RFB1 depends on a frequency of the clock signal CLK, that is the variable feedback resistor RFB1 can be controlled to have the lower resistance by applying the clock signal CLK and the inverted clock signal CLKB having higher frequency, and the variable feedback resistor RFB1 can be controlled to have the higher resistance by applying the clock signal CLK and the inverted clock signal CLKB having lower frequency.

In the embodiment shown in FIG. 5, the variable feedback resistor RFB1 is controlled to have different resistances to make the high-pass filter have different 3-dB corner frequencies. In another embodiment, the feedback capacitor CFB1 may be a variable feedback capacitor, and the variable feedback capacitor can be controlled to have different capacitances to make the high-pass filter have different 3-dB corner frequencies. This alternative design shall fall within the scope of the present invention.

In one embodiment, the circuit 100 and the circuit 500 can be an audio processor, an application processor, or a digital microphone coupled to the application processor within an electronic device such as a smart phone or a tablet.

Briefly summarized, in the circuit of the present invention, the circuit can be controlled to have the greater high-pass corner frequency to shorten the settling time when the circuit starts to process the audio signal, and then the circuit is controlled to have the lower high-pass corner frequency to keep the audio data recording performance. Therefore, the present invention can effectively improve the settling time without influencing the data recording performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An input stage of a chip, comprising:
a variable resistor, wherein the variable resistor has a first electrode and a second electrode, the first electrode is coupled to a pad of the chip, and the variable resistor is for directly receiving an input signal from the pad of the chip to generate a first signal; and
an amplifier with a feedback resistor, wherein an input terminal of the amplifier is coupled to the second electrode of the variable resistor, and the amplifier is for amplifying the first signal to generate an output signal;
wherein in a first mode, the variable resistor is controlled to have a first resistance to shorten a settling time of the output signal, and in a second mode, the variable resistor is controlled to have a second resistance greater than the first resistance.

2. The input stage of claim 1, wherein when the input stage starts to process the input signal, initially the input stage of the chip operates in the first mode, and then the input stage of the chip operates in the second mode.

3. The input stage of claim 1, wherein the feedback resistor is a variable feedback resistor, and in the first mode, the variable resistor is controlled to have the first resistance, and the variable feedback resistor is controlled to have a third resistance; and in the second mode, the variable resistor is controlled to have the second resistance, and the variable feedback resistor is controlled to have a fourth resistance greater than the third resistance.

4. An input stage of a chip, comprising:
an input capacitor, for directly receiving an input signal from a pad of the chip to generate a first signal; and
an amplifier with a feedback resistor and a feedback capacitor, for amplifying the first signal to generate an output signal, wherein the feedback capacitor is a variable feedback capacitor;
wherein in a first mode, the feedback capacitor is controlled to have the a first capacitance to shorten a settling time of the output signal, and in a second mode, the feedback capacitor is controlled to have a second capacitance greater than the first capacitance.

5. The input stage of claim 4, wherein when the input stage starts to process the input signal, initially the input stage of the chip operates in the first mode, and then the input stage of the chip operates in the second mode.

6. The input stage of claim 4, wherein the feedback resistor is implemented by a switched capacitor controlled by a clock signal, and the resistance of feedback resistor is controlled by controlling a frequency of the clock signal.

7. A circuit, comprising:
a filter with an amplifier circuit, for filtering and amplifying an input signal to generate an output signal;
wherein a corner frequency of the filter is adjustable to control a settling time of the output signal;
wherein the circuit is an input stage of a chip, and the filter directly receives the input signal from a pad of the chip to generate a filtered input signal, and the amplifier circuit amplifies the filtered input signal to generate the output signal;
wherein the filter comprises a variable resistor, the variable resistor has a first electrode and a second electrode, the first electrode is coupled to the pad of the chip, the second electrode is coupled to an input terminal of the amplifier, and the variable resistor is controlled to have different resistances to make the filter have different corner frequencies.

8. The circuit of claim 7, wherein the filter is a high-pass filter, and when the circuit starts to process the input signal, initially the filter is controlled to have a higher corner frequency to shorten the settling time, and then the filter is controlled to have a lower corner frequency.

9. The circuit of claim 7, wherein the variable resistor is arranged to work with a capacitor external to the chip to serve as the filter.

10. The circuit of claim 7, wherein the filter is a high-pass filter, and when the circuit starts to process the input signal, initially the variable resistor is controlled to have the lower resistance to make the filter have the higher corner frequency, and then the variable resistor is controlled to have the higher resistance to make the filter have the lower corner frequency.

11. The circuit of claim 10, wherein the amplifier circuit comprises an amplifier and a variable feedback resistor, and when the circuit starts to process the input signal, initially the variable resistor is controlled to have the lower resistance to make the filter have the higher corner frequency, and the variable feedback resistor is controlled to have a lower resistance; and then the variable resistor is controlled to have the higher resistance to make the filter have the lower corner frequency, and the variable feedback resistor is controlled to have a higher resistance.

* * * * *